US012584850B2

(12) United States Patent
Sato et al.

(10) Patent No.: US 12,584,850 B2
(45) Date of Patent: Mar. 24, 2026

(54) HIGHLY ACCELERATED STRESS TEST DEVICE AND METHOD FOR HIGHLY ACCELERATED STRESS TEST

(71) Applicant: HIRAYAMA MANUFACTURING CORPORATION, Kasukabe (JP)

(72) Inventors: Akira Sato, Kasukabe (JP); Shinichi Yumoto, Kasukabe (JP); Masahiro Uchita, Kasukabe (JP)

(73) Assignee: HIRAYAMA MANUFACTURING CORPORATION, Kasukabe (JP)

( * ) Notice: Subject to any disclaimer, the term of this patent is extended or adjusted under 35 U.S.C. 154(b) by 318 days.

(21) Appl. No.: 18/539,433

(22) Filed: Dec. 14, 2023

(65) Prior Publication Data

US 2024/0210304 A1 Jun. 27, 2024

(30) Foreign Application Priority Data

Dec. 21, 2022 (JP) ................................. 2022-204569

(51) Int. Cl.
*G01N 17/00* (2006.01)
*G01N 1/44* (2006.01)
*G01R 31/00* (2006.01)
(52) U.S. Cl.
CPC ............. *G01N 17/002* (2013.01); *G01N 1/44* (2013.01); *G01N 17/00* (2013.01); *G01R 31/003* (2013.01)
(58) Field of Classification Search
CPC ........ G01N 17/002; G01N 1/44; G01N 17/00; G01R 31/003
See application file for complete search history.

(56) References Cited

U.S. PATENT DOCUMENTS

| | | | | |
|---|---|---|---|---|
| 2010/0127089 A1* | 5/2010 | Sakami | ................ | F24F 11/0008 |
| | | | | 236/44 C |
| 2012/0186664 A1* | 7/2012 | DiLeo | .................... | G01N 5/025 |
| | | | | 73/29.02 |

FOREIGN PATENT DOCUMENTS

| | | | |
|---|---|---|---|
| JP | 2009294176 A | * | 12/2009 |
| JP | 5911455 B2 | | 4/2016 |

OTHER PUBLICATIONS

JP-2009294176-A, English Translation (Year: 2009).*

* cited by examiner

*Primary Examiner* — Ryan D Walsh
(74) *Attorney, Agent, or Firm* — Myers Wolin, LLC

(57) ABSTRACT

A highly accelerated stress test device includes: a first heater that heats a test space; a second heater that heats a steam generating space; a first sensor that measures a first temperature of the test space; a second sensor that measures a second temperature of the steam generating space; an item temperature sensor that is directly attached to a sample placed in the test space and that measures an item temperature of the sample; and a controller that prepares, as candidates for a test mode, a normal mode in which on-off control of each of the first and second heaters is carried out based on the first and second temperatures, and an item-temperature mode in which the on-off control is carried out based on the item and second temperatures, and carries out the on-off control according to the test mode that is set with a test condition of the sample.

10 Claims, 3 Drawing Sheets

HIGHLY ACCELERATED STRESS TEST DEVICE AND METHOD FOR HIGHLY ACCELERATED STRESS TEST

CROSS-REFERENCE TO THE RELATED APPLICATION

This application claims priority under 35 U.S.C. § 119(a) to Japanese Patent Application No. 2022-204569 filed in Japan on Dec. 21, 2022, the contents of which are hereby incorporated by references.

TECHNICAL FIELD

The present disclosure relates to a highly accelerated stress test device and a method for highly accelerated stress test.

BACKGROUND ART

A highly accelerated stress test device which evaluates the reliability of an electronic component and an electric component in a short time has been known. The highly accelerated stress test device is a type of environmental test device, and controls the environment (e.g., temperature, humidity, pressure) in a test chamber where a sample (test target) is placed to meet a set test condition. For example, Patent Literature 1 discloses an environmental test device in which a main sensor is disposed near a blowing duct of a blower in a test chamber, and a sub-sensor is disposed near a test target in the test chamber. This device acquires a difference between physical amounts (for example, temperature and humidity) detected by the main sensor and the sub-sensor in real time, and performs feedback control using the difference. Even under a condition in which the ambient temperature of the test target tends to largely deviate from the detected temperature of the main sensor, this device is regarded to be capable of converging the ambient temperature of the test target to the target set temperature with high speed and high accuracy.

RELATED ART DOCUMENTS

Patent Literature

Patent Literature 1: Publication of Japanese Patent No. 5911455

SUMMARY

Problems

However, in the device of above Patent Literature 1, since the test target is close to but is separated from the sub sensor, the temperature of the test target itself cannot be grasped directly. Accordingly, for example, when a sample (test target) has a property of generating heat or has a large heat capacity, there is a possibility that the ambient temperature of the sample deviates from the temperature of the sample itself during the process of heating the inside of the test chamber, which consequently makes it difficult to ensure high-level test accuracy.

The certain exemplary embodiments of the present disclosure has been devised in view of such a problem, and one of the objects of certain exemplary embodiments is to provide a highly accelerated stress test device and a method for a highly accelerated stress test capable of carrying out a test at high accuracy irrespective of the type and the property of a sample. In addition, another object herein is to achieve an advantageous effect that is derived from each configuration illustrated in the following DESCRIPTION OF EMBODIMENTS and that is not obtained by the related technique.

Means to Solve Problems

The disclosed highly accelerated stress test device can be implemented as the embodiments or the application examples disclosed below and solves at least a part of the above problem.

A highly accelerated stress test device in an exemplary embodiment disclosed herein includes: a test space where a sample is placed therein; a steam generating space that generates steam to be supplied to the test space; a first heater that heats the test space; a second heater that heats the steam generating space; a first temperature sensor that measures a temperature of the test space; a second temperature sensor that measures a temperature of the steam generating space; an item temperature sensor that is directly attached to the sample placed in the test space and that measures a temperature of the sample; and a controller that receives respective measured values of the first temperature sensor, the second temperature sensor, and the item temperature sensor, and that carries out on-off control of each of the first heater and the second heater.

The controller prepares, as candidates for a test mode to be set, a normal mode in which the on-off control is carried out based on the measured values of the first temperature sensor and the second temperature sensor, and an item-temperature mode in which the on-off control is carried out based on the measured values of the item temperature sensor and the second temperature sensor. The controller carries out the on-off control according to the test mode that is set with a test condition of the sample.

A method for highly accelerated stress test in an exemplary embodiment disclosed herein using a highly accelerated stress test device including a test space where a sample is placed therein and a steam generating space that generates steam to be supplied to the test space, the method includes: directly attaching an item temperature sensor that measures a temperature of the sample to the sample and then placing the sample in the test space, or placing the sample in the test space and then directly attaching the item temperature sensor to the sample; and setting a test condition of the sample and a test mode of the highly accelerated stress test. The method includes: when the test mode is set to a normal mode, carrying out, based on a measured value of a first temperature sensor that measures a temperature of the test space and a measured value of a second temperature sensor that measures a temperature of the steam generating space, on-off control of each of a first heater that heats the test space and a second heater that heats the steam generating space; and when the test mode is set to an item-temperature mode different from the normal mode, carrying out the on-off control based on a measured value of the item temperature sensor and the measured value of the second temperature sensor.

Effects

According to exemplary embodiments of the disclosed highly accelerated stress test device and the method for highly accelerated stress test, highly accurate testing can be carried out regardless of the type and the property of a sample.

DESCRIPTION OF EMBODIMENTS

With reference to the drawings, description will now be made in relation to a highly accelerated stress test device and a method for highly accelerated stress test as embodiments. The highly accelerated stress test device is a device capable of carrying out a test that simulates and accelerates an environment mainly focusing on a temperature, a humidity, and a pressure. The method for highly accelerated stress test is a method that carries out a test using this device. The following embodiments are merely illustrative and are not intended to exclude the application of various modifications and techniques not explicitly described therein. The configuration of the embodiments can be implemented with various modifications without departing from the gist thereof. Also, the configuration of the embodiments can be selected or omitted as necessary or combined as appropriate.

The highly accelerated stress test device includes a test space where a sample is placed therein and a steam generating space that generates steam, and the steam generated in the steam generating space is supplied to the test space and the environment in the test space is thereby controlled to perform the test. The highly accelerated stress test device is roughly classified into two types according to the difference of the structures. One type is a "single-chamber-type" (or "single-vessel-type") highly accelerated stress test device that includes a test space where a sample is placed and a steam generating space where steam is generated accommodated in a single chamber (such as a pressure container (vessel) or a furnace), and the other type is a "dual-chamber-type" (or "dual-vessel-type") highly accelerated stress test device that includes a test space and a steam generating space accommodated in respective different chambers (such as pressure containers (vessels) or furnaces). The following embodiment describes, for example, a dual-chamber-type highly accelerated stress test device, but the present disclosure is also applicable to a single-chamber-type highly accelerated stress test device, which is to be described in "4. Miscellaneous".

1. Example of Configuration of Highly Accelerated Stress Test Device

Figure 1:
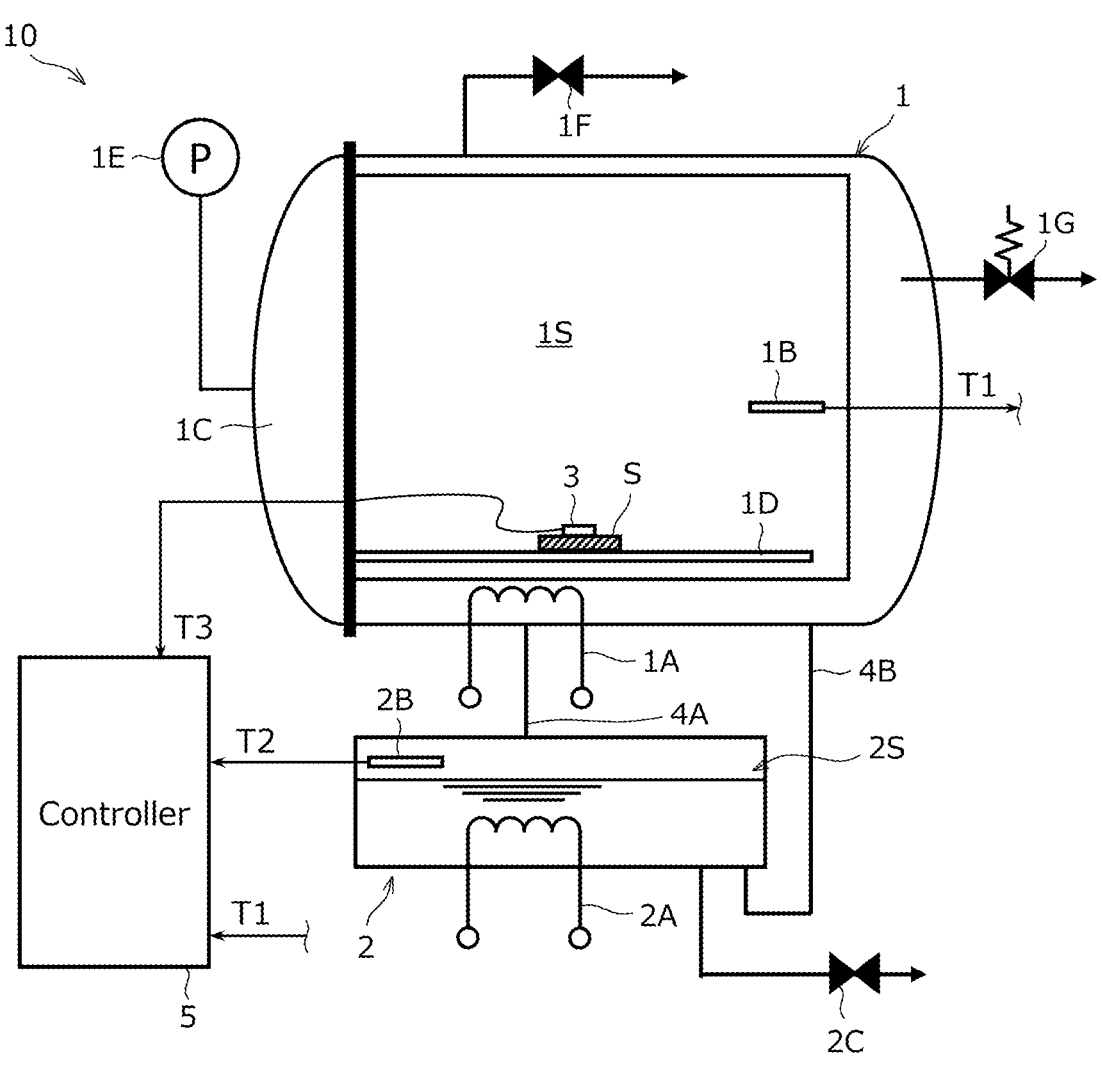
FIG. 1 is a schematic diagram illustrating a highly accelerated stress test device according to an embodiment.

FIG. 1 is a schematic diagram of a highly accelerated stress test device 10 (hereinafter referred to as a "HAST device 10") according to the present embodiment. The HAST device 10 has a dual-chamber structure in which a test chamber 1 (test unit) where a sample S is placed therein and a steam generator 2 (steam generating chamber, steam generating unit) that generates steam are provided independently of each other. The interior space (hereinafter referred to as "test space 1S") of the test chamber 1 and the interior space (hereinafter referred to as "steam generating space 2S") of the steam generator 2 are communicated to each other via pipes 4A and 4B. The steam generated in the steam generating space 2S is supplied to the test space 1S through a pipe 4A, and the liquid generated (condensed) in the test space 1S is returned to the steam generating space 2S through the other pipe 4B.

The test chamber 1 is, for example, a pressure container having a cylindrical shape with a bottom and having an accessible opening to the test space 1S on, for example, a lateral direction (left side in the drawing), and forms a sealed test space 1S by closing the opening with a door 1C attached to the test chamber 1. The test chamber 1 is provided with a test chamber heater 1A (hereinafter also referred to as a "first heater 1A") that heats the test space 1S and a test chamber temperature sensor 1B (hereinafter also referred to as a "first temperature sensor 1B") that measures a temperature T1 (hereinafter also referred to as a "first temperature T1").

The first heater 1A is provided, for example, in a lower portion of the test chamber 1, and heats the test space 1S while being powered. The on-off control (control of powered/not-powered) of the first heater 1A is carries out by a controller 5 to be described below. The first temperature sensor 1B is provided on, for example, a side surface except for the door 1C of the test chamber 1, and is spaced from the first heater 1A so as to be able to measure the overall temperature of the test space 1S. A measured value (first temperature T1) of the first temperature sensor 1B is inputted into the controller 5.

The steam generator 2 is provided completely separately from the test chamber 1, and generates steam by evaporating water stored in the steam generating space 2S. The steam generator 2 is provided with a steam generator heater 2A (hereinafter also referred to as a "second heater 2A") that heats the steam generating space 2S and a steam generator temperature sensor 2B (hereinafter also referred to as a "second sensor 2B") that measures the temperature T2 (hereinafter also referred to as a "second temperature T2) of the steam generating space 2S.

The second heater 2A is provided at the lower portion of the steam generator 2, is located at a position being immersed in water, and heats the steam generating space 2S while being powered. The on-off control (control of powered/not-powered) of the second heater 2A is carried out by the controller 5. The second temperature sensor 2B is provided at an upper position of steam generating space 2S and is located at a position not being immersed in water, and measures the temperature of the steam in the steam generating space 2S. A measured value (second temperature T2) of the second temperature sensor 2B is also inputted into the controller 5.

The HAST device 10 of the present embodiment is provided with a tray 1D where a sample S is placed thereon, a pressure gauge 1E that measures the pressure in the test space 1S, an air vent valve 1F interposed in a passage for exhausting air in the test space 1S, a pressure safety valve 1G that opens when the test space 1S becomes too high in pressure, and a drainage valve 2C interposed in a passage for draining the water in the steam generating space 2S. The tray 1D is fixed to the door 1C and is movable by sliding in the test chamber 1 together with the door 1C. A plurality of non-illustrated voltage applying terminals are provided on the inner surface (the surface facing the inside of the test chamber 1) of the door 1C. The voltage applying terminals are used in a powering test.

Furthermore, the HAST device 10 includes a temperature sensor 3 (hereinafter also referred to as an "item temperature sensor 3") provided to be directly attachable on a sample S placed in the test space 1S. The item temperature sensor 3 measures the temperature T3 (hereinafter also referred to as an "item temperature T3") of the sample S, and may be attached directly to the sample S before the test, or may be attached directly to the sample S after the sample S is placed in the test space 1S. The measured value (item temperature T3) of the item temperature sensor 3 is also inputted into the controller 5. The item temperature sensor 3 of the present embodiment is fixed to the door 1C. Since the item temperature sensor 3 is integrated with the door 1C and the tray 1D and can be moved with the door 1C and the tray 1D, the position of the item temperature sensor 3 with respect to the sample S is not displaced when the door 1C is closed after the item temperature sensor 3 is attached to the sample S placed on tray 1D.

The item temperature sensor 3 of the present embodiment is a flexible sensor made (formed) from flexible material. The item temperature sensor 3 has a part (detecting unit) attached to a sample S to detect the item temperature T3 and a harness connecting the detecting unit and the door 1C. It is sufficient that at least the harness is made from flexible material, and the detection unit is also preferably made from flexible material. This embodiment allows the item temperature sensor 3 to be easily attached to any sample S. The number of item temperature sensors 3 is not particularly limited, and may be one or more. When a plurality of item temperature sensors 3 are provided, each of the item temperature sensors 3 may be configured to be attachable to and detachable from the test chamber 1. With such a configuration, the number of item temperature sensors 3 can be changed according to the test, so that the test accuracy and usability can be enhanced.

The HAST device 10 has the controller 5 into which the measured values of the three temperature sensors 1B, 2B, and 3 are inputted. The controller 5 is a controller board or an electronic controller device having a microprocessor, a storing device such as a ROM and a RAM, and carries out on/off control of each of the first heater 1A and the second heater 2A.

2. Example of Control Configuration

Next, description will now be made in relation to a method for highly accelerated stress test using the HAST device 10, particularly focusing on on/off control performed by the HAST device 10. The controller 5 of the HAST device 10 prepares, as candidates for a test mode to be set, a normal mode in which the on-off control is carried out on the basis of the respective measured values (temperatures T1 and T2) of the first temperature sensor 1B and the second temperature sensor 2B, and an item-temperature mode in which the on-off control is carried out on the basis of the respective measured values (temperatures T3 and T2) of the item temperature sensor 3 and the second temperature sensor 2B.

The normal mode is a conventional test mode in a HAST device 10, and the item-temperature mode is a new test mode which is not conventional. The difference between these modes is whether the first temperature sensor 1B or the item temperature sensor 3 is used as the temperature information of the test chamber 1. That is, the HAST device 10 selectively uses (switches) the test mode, depending on whether the first temperature T1, which is the overall temperature of the test space 1S or the item temperature T3, which is the temperature of the sample S itself, is used for the test.

In the method for highly accelerated stress test using the HAST device 10, a test condition (including conditions related to the temperature and the humidity) is set before the start of operation of the HAST device 10. In the present embodiment, the test mode (the normal mode or the item-temperature mode) is also set at this timing. The controller 5 carries out the on-off control in accordance with the test mode which is set with (together with) the test condition of the sample S. In the following explanation of a method for highly accelerated stress test, the control performed when the normal mode is selected will be detailed and then the control preformed when the item-temperature mode is selected is described appropriately with reference to the flowcharts of FIGS. 2 and 3. The flowchart of FIG. 2 is started when the HAST device 10 starts its operation.

If carrying out a test, the user first places a sample S in the test space 1S, powers on the HAST device 10, and then sets a test condition and a test mode to the HAST device 10. The order of these steps may be reversed. When the user operates the switch to start the test after making the test ready, the controller 5 receives the signal responsive to the switch operation and starts the operation of the HAST device 10. In addition to the on-off control, the controller 5 also performs the opening-closing control of the air vent valve 1F and the drainage valve 2C, which are however the same as the related control, so the explanation thereof is omitted here.

Figure 2:
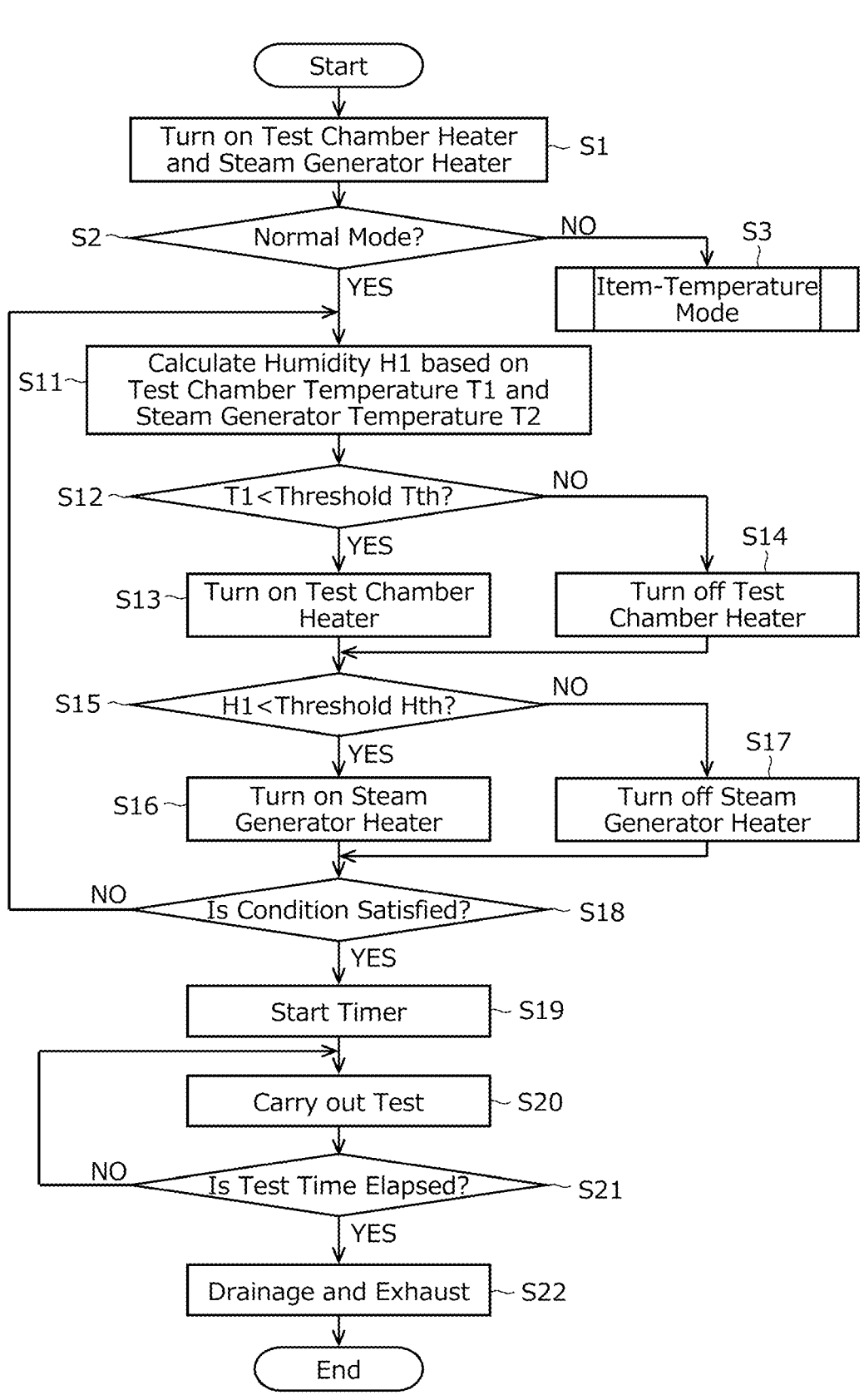
FIG. 2 is an example of a flowchart explaining a method of highly accelerated stress test using the highly accelerated stress test device of FIG. 1.
Figure 3:
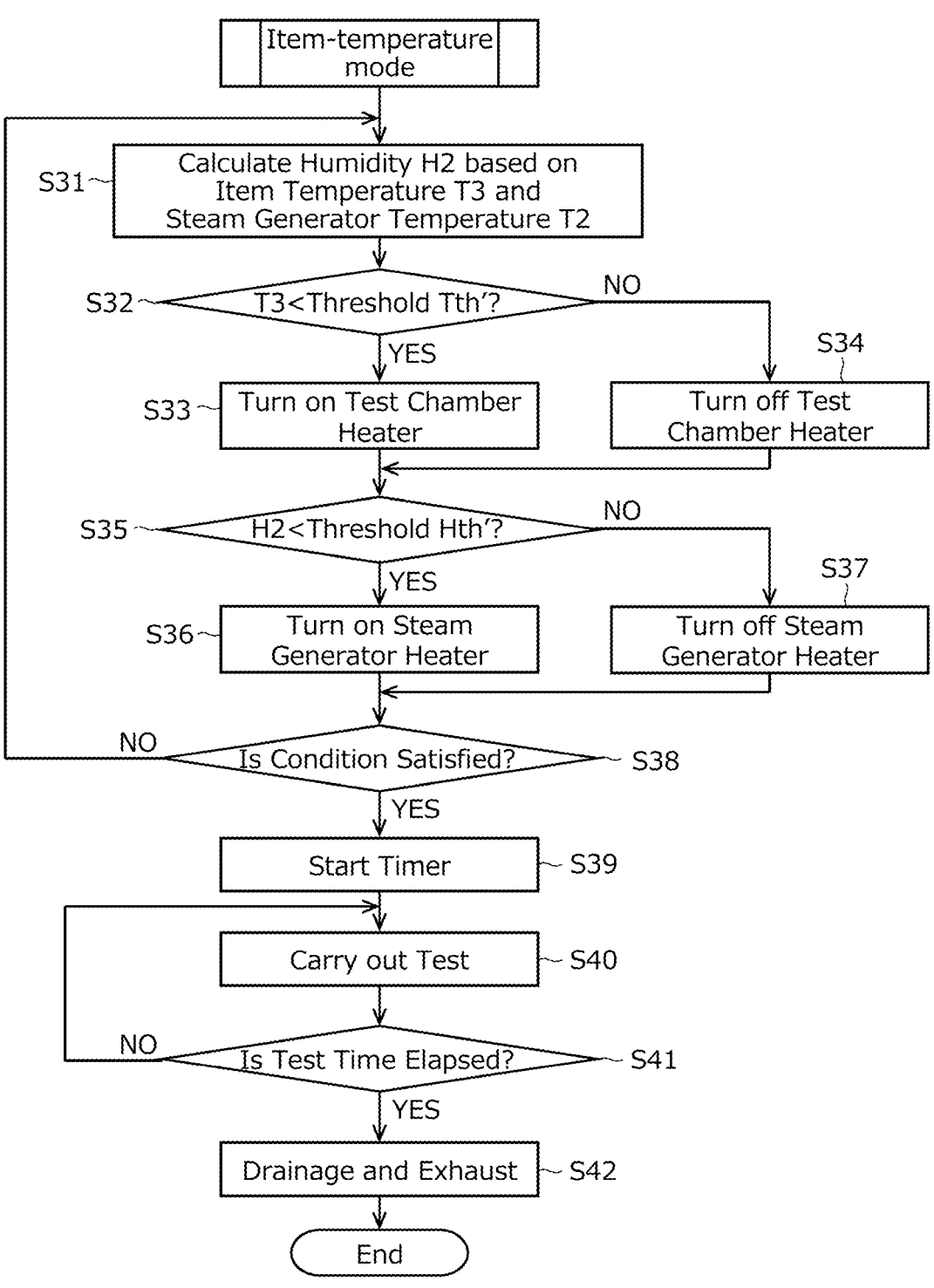
FIG. 3 is an example of a sub-flowchart of FIG. 2.

When the operation starts, the controller 5 turns on (makes powered state) both the first heater 1A (test chamber heater) and the second heater 2A (steam generator heater), and starts to heat the test space 1S and the steam generating space 2S (Step S1 in FIG. 2). Next, the controller 5 determines whether or not the test mode is the normal mode (Step S2), and if the test mode is the normal mode, the process proceeds to Step S11. If the test mode is the item-temperature mode, the process proceeds to Step S3 and the controller 5 carries out the control shown in the flowchart of FIG. 3 to be described below.

When the normal mode is set, the controller 5 calculates a humidity H1 (hereinafter also referred to as a "first humidity H1") of the test space 1S based on the first temperature T1 (test chamber temperature) and the second temperature T2 (steam generator temperature) using a unique calculation expression (Step S11). For example, the controller 5 converts the first temperature T1 and the second temperature T2 into the first humidity H1 by using the unique calculation expression.

When the normal mode is set, the controller 5 carries out the on-off control of the first heater 1A in accordance with the first temperature T1, and carries out the on-off control of the second heater 2A in accordance with the calculated first humidity H1.

For example, when the first temperature T1 is less than a predetermined threshold Tth, the controller 5 turns on the first heater 1A (Steps S12 and S13), and when the first temperature T1 is the threshold Tth or more, turns off (makes not-powered state) the first heater 1A (Steps S12 and S14). The threshold Tth is a temperature threshold obtained by adding a first predetermined value (for example, several degrees Celsius) to a set temperature which is set as the test condition.

Since the first temperature T1 is in the relationship T1<Tth immediately after the start of the operation, the first heater 1A is kept to be "on" state and the test space 1S is continuously heated. Then, a certain length of time elapses to satisfy the relationship T1≥Tth, the first heater 1A is switched "off" and excessive temperature rise of the test space 1S is prevented. Then, when the first temperature T1 is lowered a little and comes to be T1<Tth, the first heater 1A is switched "on". As the above, the temperature of the test space 1S is appropriately maintained by repeating turning on and turning off of the first heater 1A.

In addition, when the first humidity H1 is less than a predetermined threshold Hth, the controller 5 turns on the second heater 2A (Steps S15 and S16), and when the first humidity H1 is the threshold Hth or more, turns off (makes not-powered state) the second heater 2A (Steps S15 and S17). The threshold Hth is a humidity threshold obtained by adding a second predetermined value (for example, several %) to a set humidity which is set as the test condition.

Since the first humidity H1 is in the relationship H1<Hth immediately after the start of the operation, the second heater 2A is kept to be "on" state and the steam generating space 2S is continuously heated. Then, a certain length of time elapses to satisfy the relationship H1≥Hth, the second heater 2A is switched "off", and condensation appeared on the sample S due to excessively high humidity of the test space 1S can be prevented. Then, when the first humidity H1 is lowered a little and comes to be H1<Hth, the second heater 2A is switched "on". As the above, the humidity of the test space 1S is appropriately maintained by repeating turning on and turning off of the second heater 2A. Steps S12-S14 and Steps S15-S17 may be performed in the reverse order.

The controller 5 determines whether or not the environment of the test space 1S comes to satisfy the test condition (Step S18), and repeats the process of Steps S11-S17 until the test condition is satisfied. In the determination of Step S18, the controller 5 may determine that the condition is satisfied when the environment of the test space 1S completely matches the test condition, or may determine that the condition is satisfied when the environment of the test space 1S reaches a predetermined range ("set temperature"±"predetermined temperature", "set humidity"±"predetermined humidity") including the test condition.

When determining the environment of the test space 1S to satisfy the test condition after the start of the operation (Step S18), the controller 5 starts the timer count (Step S19), performs the test, and measures the time (Step S20). While the test is being performed, the controller 5 also performs the on-off control the same as above Steps S11-S17. That is, throughout the test, the controller 5 calculates the first humidity H1 based on the first temperature T1 inputted from the first temperature sensor 1B and the second temperature T2 inputted from the second temperature sensor 2B, and performs the on-off control of the first heater 1A in accordance with the first temperature T1 and the on-off control of the second heater 2A in accordance with the first humidity H1. This properly maintains the environment of the test space 1S even during the test.

When the timer count reaches the set test time (for example, 100 hours), in other words, when the test time elapsed (Step S21), the controller 5 finishes the test and drains the steam generator 2 and exhausts the air in the test chamber 1 (Step S22). Also in the process of last drainage and exhaust, the temperature of the test space 1S can be gently lowered with a predetermined gradient while maintaining the humidity of the test space 1S by carrying out the on-off control of the first heater 1A and the second heater 2A.

The above process is the control when the normal mode is set. When the item-temperature mode is set, the item temperature T3 is used instead of the first temperature T1 described above, which requires the user to attach the item temperature sensor 3 to a sample S before or after the sample S is placed. If the plurality of item temperature sensors 3 are provided, the plurality of item temperature sensors 3 may be attached to several samples S among a plurality of samples S of the same type, or to a plurality of samples S of respective different types for simultaneously testing the plurality of the samples S of different types. In the latter case, the item temperature sensors 3 are numbered, and a type of a sample S and the number of the item temperature sensor 3 attached to the sample S are stored in the controller 5 in association with each other. For example, this information may be inputted by the user at the same time the test condition is set, or a system or a device that can automatically detect this information may be provided.

When the item mode is set, the controller 5 calculates a humidity H2 (hereinafter also referred to as a "second humidity H2") of the test space 1S based on the item temperature T3 and the second temperature T2 (steam generator temperature) using a unique calculation expression (Step S31). For example, the controller 5 converts the item temperature T3 and the second temperature T2 into the second humidity H2 by using the unique calculation expression. When the plurality of item temperature sensors 3 are used, the average value, the median value, or the representative value of the values measured by the respective item temperature sensors 3 may be used as the item temperature T3, or the average value or the median value of the second humidity H2 may be calculated by calculating values of the second humidity H2 from the values measured in the respective item temperature sensors 3.

When the item-temperature mode is set, the controller 5 carries out the on-off control of the first heater 1A in accordance with the item temperature T3, and carries out the on-off control of the second heater 2A in accordance with the calculated second humidity H2. If the plurality of item temperature sensors 3 are used, the average value or the like may be used as in the above calculation.

For example, when the item temperature T3 is less than a predetermined threshold Tth', the controller 5 turns on the first heater 1A (Steps S32 and S33), and when the item temperature T3 is the threshold Tth' or more, turns off (makes not-powered state) the first heater 1A (Steps S32 and S34). The threshold Tth' is a temperature threshold obtained by adding a first predetermined value (for example, several degrees Celsius) to a set temperature which is set as the test condition, and may be the same as or different from the threshold Tth of the normal mode.

Since the item temperature T3 is in the relationship T3<Tth' immediately after the start of the operation, the first heater 1A is kept to be "on" state and the test space 1S is continuously heated. Then, a certain length of time elapses to satisfy the relationship T3≥Tth', the first heater 1A is switched "off", and excessive temperature rise of the sample S and the test space 1S is prevented. Then, when the item temperature T3 is lowered a little and comes to be T3<Tth', the first heater 1A is switched "on". As the above, the temperature of the test space 1S is appropriately maintained and the excessive temperature rise of the sample S is prevented by repeating turning on and turning off of the first heater 1A.

In addition, when the second humidity H2 is less than a predetermined threshold Hth', the controller 5 turns on the second heater 2A (Steps S35 and S36), and when the second humidity H2 is the threshold Hth' or more, turns off (makes not-powered state) the second heater 2A (Steps S35 and S37). The threshold Hth' is a humidity threshold obtained by adding a second predetermined value (for example, several percent) to a set temperature which is set as the test condition, and may be the same as or different from the threshold Hth of the normal mode.

Since the second humidity H2 is in the relationship H2<Hth' immediately after the start of the operation, the second heater 2A is kept to be "on" state and the steam generating space 2S is continuously heated. Then, a certain length of time elapses to satisfy the relationship H2≥Hth', the second heater 2A is switched "off", and condensation appeared on the sample S due to excessively high humidity of the test space 1S can be prevented. Then, when the second humidity H2 is lowered a little and comes to be H2<Hth', the second heater 2A is switched "on". As the above, the humidity of the test space 1S is appropriately maintained and condensation generated on the sample S is prevented at a higher probability than the normal mode by repeating turning on and turning off of the second heater 2A. Steps S32-S34 and Steps S35-S37 may be performed in the reverse order.

The controller 5 determines whether or not the environment of the test space 1S comes to satisfy the test condition (Step S38), and repeats the process of Steps S31-S37 until the test condition is satisfied. The process of Steps S38-S42 is the same as the process of Steps S18-S22 described in the normal mode, so the detailed description thereof will be omitted. However, even when the item-temperature mode is set, the controller 5 performs the same on-off control as performed in the above-described Steps S31-S37 during the test. That is, throughout the test, the controller 5 calculates the second humidity H2 based on the item temperature T3 inputted from the item temperature sensor 3 and the second temperature T2 inputted from the second temperature sensor 2B, and carries out the on-off control of the first heater 1A in accordance with the item temperature T3 and the on-off control of the second heater 2A in accordance with the second humidity H2. This exactly grasps the temperature state of the sample S during the test and properly maintains the environment of the test space 1S even during the test.

3. Advantageous Effect

In the above HAST device 10, the controller 5 performs the on-off control of the first heater 1A and the on-off control of the second heater 2A, and prepares the normal mode in which the on-off control is performed on the basis of the first temperature T1 and the second temperature T2 and the item-temperature mode in which the on-off control is performed on the basis of the item temperature T3 and the second temperature T2. With this configuration, the controller 5 performs the on-off control according to the set test mode that is set with the set test condition of a sample S.

In the item-temperature mode, the temperature (item temperature T3) of the sample S can be directly measured, so that the temperature of the sample S itself can be grasped and a more accurate test can be performed. In addition, for example, even when a sample S has a property of less raising its temperature than the test space 1S (i.e., if the heat capacity of the sample S is large), condensation generated on the sample S can be prevented at a higher probability than the normal mode. In contrast, even if a sample S is an object that generates heat or the sample S has a property that is more likely to raise its temperature than the test space 1S, the excessive temperature rise of the sample S is suppressed. Therefore, there is a possibility that the allowable calorific value of a sample S can be increased. In addition, since the temperature of the sample S during the test can also be grasped, the present disclosure can be effective in proving that the sample S is kept at a desired temperature for researching and developing and a thesis, for example.

In addition, in the above-described HAST device 10, at least two test modes are prepared (defined) as candidates for a test mode to be set, the user can select one from these test modes to perform a test, thereby enhancing usability. For example, depending on the type and the property of a sample S, the temperature of the sample S itself may substantially match the temperature (i.e., the first temperature T1) of the test space 1S. In this situation, a test in the normal mode is sufficient because the test can be carried out at a high accuracy without grasping the temperature of the sample S itself. In addition, the normal mode can save the time and effort for attaching the item temperature sensor 3 to the sample S.

The item temperature sensor 3 described above is a flexible sensor and therefore can be easily attached to any sample S, so that the operability can be enhanced.

Further, in the above HAST device 10, the item temperature sensor 3 is fixed to the door 1C, and the door 1C, the tray 1D, and item temperature sensor 3 are movable integrally with each other. This configuration allows the position of the item temperature sensor 3 with respect to a sample S not to displaced in a series of operation of placing the sample S on the tray 1D, attaching the item sensor 3 to the sample S, and then closing the door 1C. Therefore, an exact item temperature T3 can be measured, and high testing accuracy can be ensured.

In the above HAST device 10, when the normal mode is set, the humidity H1 (the first humidity) is calculated on the basis of the first temperature T1 and the second temperature T2, and when the item-temperature mode is set, the humidity H2 (the second humidity) is calculated on the basis of the item temperature T3 and the second temperature T2. Then, the on-off control is carried out, using the humidity H1 and the humidity H2 in the normal mode and the item-temperature mode, respectively. As the above, either test mode can be completed with only temperature sensors 1B, 2B, and 3, so that the device structure can be simplified.

In the above HAST device 10, when normal mode is set, the on-off control of the first heater 1A is carried out in accordance with the first temperature T1, and the on-off control of the second heater 2A is carried out in accordance with the first humidity H1. In addition, when the item-temperature mode is set, the on-off control of the first heater 1A is carried out in accordance with the item temperature T3, and the on-off control of the second heater 2A is carried out in accordance with the second humidity H2. As described above, in either test mode, since the on-off state of the second heater 2A that heats the steam generating space 2S is controlled in accordance with the humidity H1 and the humidity H2 of the test space 1S, appearing condensation on the sample S can be suppressed.

Further, the above HAST device 10 switches between the "on" state and "off" state of the first heater 1A when the first temperature T1 or the item temperature T3 is lower than or equal to or more than the respective temperature threshold Tth or Tth' obtained by adding a first predetermined value to the set temperature which is set as the test condition. Furthermore, the HAST device 10 switches between the "on" state and "off" state of the second heater 2A when the first humidity H1 or the second humidity H2 is lower than or equal to or more than the respective humidity threshold Hth or Hth' obtained by adding a second predetermined values to the set humidity set as the test condition. A highly accurate test can be accomplished with such a simple control configuration.

4. Miscellaneous

The above HAST device 10 is an example. For example, the structure and the arrangement of the item temperature sensor 3 is one example. Alternatively, the item temperature sensor 3 may be a sensor except for a flexible sensor or may be fixed to a side surface of the test chamber 1 except for the door 1C. In addition, the above-described embodiment uses, once the normal mode or the item-temperature mode is first set, the corresponding one of the first temperature T1 or the item temperature T3 until the drainage and the exhaust are completed (i.e., the completion of operation), but such control configuration is also an example and not limited to the above.

Alternatively, if the item-temperature mode is set, the control may switch a temperature to be used between the item temperature T3 and the first temperature T1 by using the item temperature T3 only during the period from the start of the operation to the satisfaction of the test condition (i.e., during the temperature rise) and then using the first temperature T1 during the test. Further alternatively, if the item-temperature mode is set, the first temperature T1 may be monitored in addition to using the item temperature T3 as described above. For example, if the item temperature T3 is less than the threshold Tth' but the first temperature T1 exceeds an upper limit value higher than the threshold Tth, the sample S would become high temperature sooner or later and therefore the first heater 1A may be switched off in the range of T3<Tth'. In addition, when the item-temperature mode is set, the on-off control may be carried out by obtaining both the item temperature T3 and the first temperature T1 and by using the average of these obtained temperatures.

The description of the test method of the above embodiment assumes that the dual-chamber-type HAST device 10 is used, but the same method can be applied to a single-chamber-type highly accelerated stress test device. Also the single-chamber-type highly accelerated stress test device can obtain the action and effect as in the above embodiment with a configuration that carries out the on-off control in accordance with a test mode in a configuration provided with a first heater that heats a test space (e.g., an interior space in a test chamber portion of a pressure container) where a sample is placed therein, a first temperature sensor that measures a temperature of the test space, a second heater that heats a steam generating space (e.g., an interior space of a steam generator of a pressure container) that generates steam, a second temperature sensor that measures the temperature of the steam generating space, and an item sensor that is directly attached to the sample and measures the temperature of the sample, and the same controller as the above embodiment. The actions and effects of the highly accelerated stress test device and the method of highly accelerated stress test of the present disclosure are not affected by the configuration of a chamber and the presence or absence of accessories. Accordingly, the configuration of a chamber and the presence or absence of accessories do not particularly affect the present disclosure.

INDUSTRIAL APPLICABILITY

The present disclosure can be used in manufacturing industry of a highly accelerated stress test device.

DESCRIPTION OF REFERENCE SIGNS

1 Test chamber (Test unit)
1A First heater (Test chamber heater)

1B First temperature sensor (Test chamber temperature sensor)
1C Door
1D Tray
1E Pressure gauge
1F Air vent valve
1G Pressure safety valve
1S Test space
2 Steam generator (Steam generating chamber, Steam generating unit)
2A Second heater (Steam generator heater)
2B Second temperature sensor (Steam generator temperature sensor)
2C Drainage valve
2S Steam generating space
3 Item temperature sensor
4A, 4B Pipe
5 Controller
10 Highly Accelerated Stress Test (HAST) device
H1 First humidity (Normal-mode humidity)
H2 Second humidity (Item-temperature-mode humidity)
Hth, Hth' Threshold (Humidity threshold)
S Sample
T1 First temperature (Temperature of test space)
T2 Second temperature (Temperature of steam generating space)
T3 Item temperature (Temperature of sample)
Tth, Tth' Threshold (Temperature threshold)

What is claimed is:

1. A highly accelerated stress test device comprising:
a test space where a sample is placed therein;
a steam generating space that generates steam to be supplied to the test space;
a first heater that heats the test space;
a second heater that heats the steam generating space;
a first temperature sensor that measures a temperature of the test space;
a second temperature sensor that measures a temperature of the steam generating space;
an item temperature sensor that is directly attached to the sample placed in the test space and that measures a temperature of the sample; and
a controller that receives respective measured values of the first temperature sensor, the second temperature sensor, and the item temperature sensor, and that carries out on-off control of each of the first heater and the second heater, wherein
the controller prepares, as candidates for a test mode to be set, a normal mode in which the on-off control is carried out based on the measured values of the first temperature sensor and the second temperature sensor, and an item-temperature mode in which the on-off control is carried out based on the measured values of the item temperature sensor and the second temperature sensor, and
the controller carries out the on-off control according to the test mode that is set with a test condition of the sample.

2. The highly accelerated stress test device according to claim 1, wherein the item temperature sensor is a flexible sensor made from flexible material.

3. The highly accelerated stress test device according to claim 1, further comprising:
a door that is attached to a test unit forming the test space and that closes an opening accessible to the test space;

a tray where the sample is placed thereon, the tray being fixed to the door and being movable by sliding in the test space, wherein the item temperature sensor is fixed to the door.

4. The highly accelerated stress test device according to claim 1, wherein the controller, when the normal mode is set, calculates a humidity of the test space based on the measured values of the first temperature sensor and the second temperature sensor, when the item-temperature mode is set, calculates the humidity of the test space based on the measured values of the item temperature sensor and the second temperature sensor, and carries out the on-off control using the humidity.

5. The highly accelerated stress test device according to claim 4, wherein the controller, when the normal mode is set, carries out the on-off control of the first heater according to a first temperature representing the measured value of the first temperature sensor and carries out the on-off control of the second heater according to the humidity, when the item-temperature mode is set, carries out the on-off control of the first heater according to an item temperature representing the measured value of the item temperature sensor and carries out the on-off control of the second heater according to the humidity.

6. The highly accelerated stress test device according to claim 5, wherein the controller, when the first temperature or the item temperature is less than a temperature threshold obtained by adding a first predetermined value to a set temperature that is set as the test condition, turns on the first heater, and when the first temperature or the item temperature is the temperature threshold or more, turns off the first heater, and when the humidity is less than a humidity threshold obtained by adding a second predetermined value to a set humidity that is set as the test condition, turns on the second heater, and when the humidity is the humidity threshold or more, turns off the second heater.

7. A method for highly accelerated stress test using a highly accelerated stress test device comprising a test space where a sample is placed therein and a steam generating space that generates steam to be supplied to the test space, the method comprising:

directly attaching an item temperature sensor that measures a temperature of the sample to the sample and then placing the sample in the test space, or placing the sample in the test space and then directly attaching the item temperature sensor to the sample;

setting a test condition of the sample and a test mode of the highly accelerated stress test;

when the test mode is set to a normal mode, carrying out, based on a measured value of a first temperature sensor that measures a temperature of the test space and a measured value of a second temperature sensor that measures a temperature of the steam generating space, on-off control of each of a first heater that heats the test space and a second heater that heats the steam generating space; and when the test mode is set to an item-temperature mode different from the normal mode, carrying out the on-off control based on a measured value of the item temperature sensor and the measured value of the second temperature sensor.

8. The method for highly accelerated stress test according to claim 7, further comprising:

when the test mode is set to the normal mode, calculating a humidity of the test space based on the measured values of the first temperature sensor and the second temperature sensor;

when the test mode is set to the item-temperature mode, calculating the humidity of the test space based on the measured values of the item temperature sensor and the second temperature sensor; and carrying out the on-off control using the humidity.

9. The method for highly accelerated stress test according to claim 8, further comprising:

when the test mode is set to the normal mode, carrying out the on-off control of the first heater according to a first temperature representing the measured value of the first temperature sensor and carrying out the on-off control of the second heater according to the humidity; and when the test mode is set to the item-temperature mode, carrying out the on-off control of the first heater according to an item temperature representing the measured value of the item temperature sensor and carrying out the on-off control of the second heater according to the humidity.

10. The method for highly accelerated stress test according to claim 9, further comprising:

when the test mode is set to the normal mode or the item-temperature mode, when the first temperature or the item temperature is less than a temperature threshold obtained by adding a first predetermined value to a set temperature that is set as the test condition, turning on the first heater, and when the first temperature or the item temperature is the temperature threshold or more, turning off the first heater; and when the humidity is less than a humidity threshold obtained by adding a second predetermined value to a set humidity that is set as the test condition, turning on the second heater, and when the humidity is the humidity threshold or more, turning off the second heater.

* * * * *